(12) United States Patent
Choi et al.

(10) Patent No.: US 9,035,312 B2
(45) Date of Patent: May 19, 2015

(54) TFT ARRAY SUBSTRATE AND FABRICATION METHOD THEREOF

(75) Inventors: Young Seok Choi, Daejeon (KR); Hong Woo Yu, Gumi-si (KR); Ki Sul Cho, Gumi-si (KR); Jae Ow Lee, Ahndong-si (KR); Bo Kyoung Jung, Jeonju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 521 days.

(21) Appl. No.: 11/316,895

(22) Filed: Dec. 27, 2005

(65) Prior Publication Data

US 2006/0145157 A1    Jul. 6, 2006

(30) Foreign Application Priority Data

Dec. 30, 2004    (KR) .......................... 10-2004-0117243

(51) Int. Cl.
| | |
|---|---|
| H01L 27/14 | (2006.01) |
| H01L 29/04 | (2006.01) |
| H01L 29/15 | (2006.01) |
| H01L 31/036 | (2006.01) |
| G02F 1/1345 | (2006.01) |
| G02F 1/1362 | (2006.01) |
| H01L 27/12 | (2006.01) |

(52) U.S. Cl.
CPC ...... *G02F 1/13458* (2013.01); *G02F 1/136213* (2013.01); *H01L 27/124* (2013.01); *H01L 27/1288* (2013.01); *H01L 27/1255* (2013.01)

(58) Field of Classification Search
USPC ........................................ 257/59, 72, E27.113
See application file for complete search history.

(56) References Cited

U.S. PATENT DOCUMENTS

| | | | | |
|---|---|---|---|---|
| 5,326,712 | A  * | 7/1994 | Bae | 438/158 |
| 6,642,074 | B2 * | 11/2003 | Hong et al. | 438/30 |
| 2002/0044228 | A1* | 4/2002 | Oh et al. | 349/40 |
| 2002/0130324 | A1* | 9/2002 | Song et al. | 257/72 |
| 2002/0132396 | A1* | 9/2002 | Yamazaki et al. | 438/149 |
| 2002/0171108 | A1 | 11/2002 | Lim et al. | |
| 2004/0036070 | A1 | 2/2004 | Yun | |
| 2004/0051103 | A1* | 3/2004 | Hong et al. | 257/72 |
| 2005/0275038 | A1* | 12/2005 | Shih et al. | 257/382 |

FOREIGN PATENT DOCUMENTS

| | | |
|---|---|---|
| DE | 10150432 | 5/2002 |
| JP | 6-230421 | 8/1994 |
| JP | 09-120083 | 5/1997 |
| JP | 2000-029071 | 1/2000 |
| JP | 2001-264811 | 9/2001 |
| JP | 2003-179069 | 6/2003 |
| JP | 2005-122182 | 5/2005 |
| JP | 2005-128555 | 5/2005 |

* cited by examiner

*Primary Examiner* — Hsin-Yi Hsieh
(74) *Attorney, Agent, or Firm* — McKenna Long & Aldridge LLP (57) ABSTRACT

A TFT array substrate is provided. The TFT array substrate includes a gate electrode connected to a gate line; a source electrode connected to a data line, the data line crossing the gate line to define a pixel region; a drain electrode facing the source electrode with a channel interposed therebetween; a semiconductor layer forming the channel between the source electrode and the drain electrode; a channel passivation layer formed on the channel to protect the semiconductor layer; a pixel electrode disposed in the pixel region to contact with the drain electrode; a storage capacitor including the pixel electrode extending over the gate line to form a storage area on a gate insulating layer on which a semiconductor layer pattern and a metal layer pattern are stacked; a gate pad extending from the gate line; and a data pad connected to the data line.

5 Claims, 11 Drawing Sheets

TFT ARRAY SUBSTRATE AND FABRICATION METHOD THEREOF

This application claims the benefit of Korean Patent Application No. 117243/2004, filed on Dec. 30, 2004, which is hereby incorporated by reference for all purposes as if fully set forth herein.

BACKGROUND OF THE INVENTION

1. Field of the Invention

The present invention relates to a thin film transistor (TFT) array substrate, and more particularly, to a TFT array substrate and a fabrication method thereof capable of protecting TFTs without a passivation layer and preventing galvanic corrosion of a data or gate pad.

2. Discussion of the Related Art

A liquid crystal display (LCD) displays an image by controlling the light transmittance of liquid crystal (LC) using an electric field.

The LCD drives the LC using an electric field generated between a pixel electrode and a common electrode respectively disposed on an upper substrate and a lower substrate facing each other.

The LCD has a TFT array substrate (lower array substrate) and a color filter array substrate (upper array substrate) facing each other, a spacer disposed between the two array substrates to maintain a cell gap, and LC filling the cell gap.

The TFT array substrate includes signal lines, TFTs, and an alignment layer coated thereon to align the LC.

The color filter array substrate includes a color filter for realizing colors, a black matrix (BM) for preventing light leakage between color filter cells, and an alignment layer coated thereon for aligning the LC.

In the LCD, because fabrication of the TFT array substrate requires a semiconductor process and a plurality of mask processes, the manufacturing process thereof is complicated and thus manufacturing costs increase.

To solve this problem, it is desirable to develop a TFT array substrate that reduces the number of mask processes.

The reason for this is that one mask process includes many processes such as a thin film deposition process, a cleaning process, a photolithography process, an etching process, a photoresist stripping process, and an inspection process.

Recently, a 4-mask process has been developed requiring one less mask process than the 5-mask processes that were previously the standard mask process of a TFT array substrate.

Figure 1:
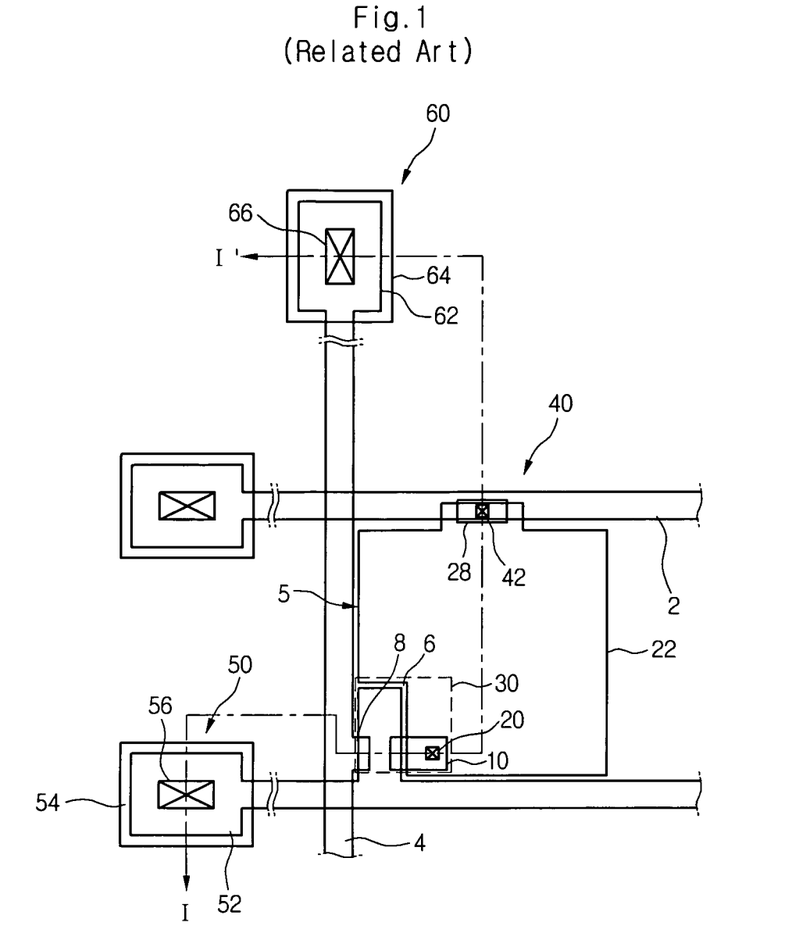
FIG. 1 is a plan view of a related art TFT array substrate fabricated using a 4-mask process.
Figure 2:
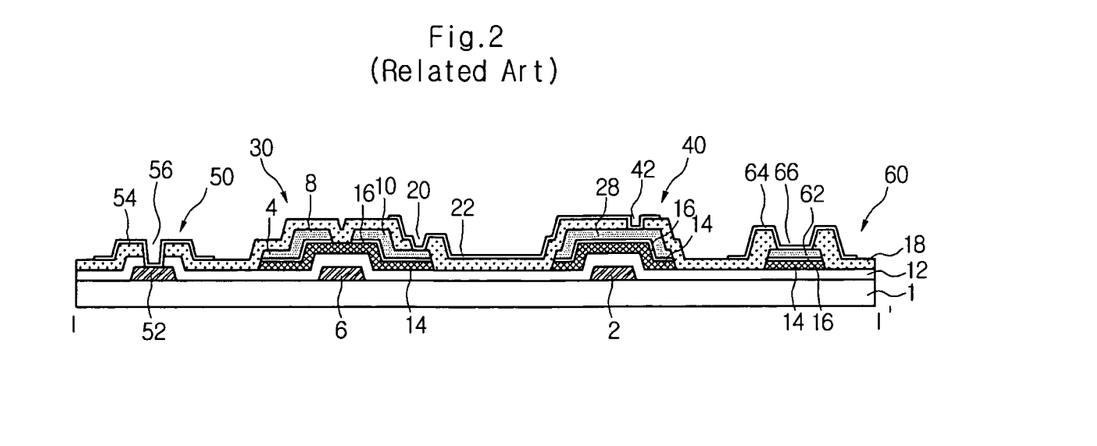
FIG. 2 is a sectional view taken along line I-I' of FIG. 1.

FIG. 1 is a plan view of a related art TFT array substrate fabricated using a 4-mask process, and FIG. 2 is a sectional view taken along line I-I' in FIG. 1.

Referring to FIGS. 1 and 2, the related art TFT array substrate of an LC panel includes a lower substrate 1, a gate line 2 and a data line 4 formed on the lower substrate to cross each other with a gate insulating layer 12 in between, a TFT 30 formed at each crossing, a pixel electrode 22 formed in a pixel region defined by the crossing gate and data lines, a storage capacitor 40 formed where a portion of the gate line 2 overlaps a storage electrode 28, a gate pad 50 connected to the gate line 2, and a data pad 60 connected to the data line 4.

The gate line 2 supplying a gate signal and the data line 4 supplying a data signal cross to define a pixel region 5.

The TFT 30 allows a pixel signal of the data line 4 to be charged and maintained at the pixel electrode 22 in response to the gate signal of the gate line. The TFT 30 includes a gate electrode 6 connected to the gate line 2, a source electrode 8 connected to the data line 4, and a drain electrode 10 connected to the pixel electrode 22.

The TFT 30 further includes an active layer 14 that overlaps the gate electrode 6 with the gate insulating layer 12 in between, to form a channel between the source electrode 8 and the drain electrode 10.

The active layer 14 overlaps the data line 4, a data pad lower electrode 62, and the storage electrode 28.

An ohmic contact layer 16 for an ohmic contact with the data line 4, the source electrode 8, the drain electrode 10, the data pad lower electrode 62, and the storage electrode 28 is further formed on the active layer 14.

The pixel electrode 22 is formed in the pixel region 5 and connected to the drain electrode 10 of the TFT 30 through a first contact hole 20 that penetrates a passivation layer 18.

An electric field generated between the pixel electrode 22 to which a pixel signal is supplied through the TFT 30 and a common electrode (not shown) to which a reference voltage is supplied. LC molecules between the lower array substrate and an upper array substrate are rotated due to dielectric anisotropy by the electric field.

The light transmittance of the pixel region 5 is changed according to the rotational degree of the LC molecules, so that a gray scale is realized.

The storage capacitor 40 includes the gate line 2 and a storage electrode 28 that overlaps the gate line 2 with the gate insulating layer 12, the active layer 14, and the ohmic contact layer 16 in between.

The storage electrode 28 is connected to the pixel electrode 22 through a second contact hole 42 formed in the passivation layer 18.

The storage capacitor 40 allows a pixel signal charged on the pixel electrode 22 to be stably maintained until a next pixel signal is charged.

The gate pad 50 is connected to a gate driver (not shown) to supply a gate signal to the gate line 2. The gate pad 50 includes a gate pad lower electrode 52 extending from the gate line 2 and a gate pad upper electrode 54 connected to the gate pad lower electrode 52 through a third contact hole 56 that penetrates the gate insulating layer 12 and the passivation layer 18.

The data pad 60 is connected to a data driver (not shown) to supply a data signal to the data line 4. The data pad 60 includes a data pad lower electrode 62 extending from the data line 4 and a data pad upper electrode 64 connected to the data pad lower electrode 62 through a fourth contact hole 66 that penetrates the passivation layer 18.

A method of fabricating a TFT array substrate of an LC panel using a 4-mask process will be described in detail with reference to FIGS. 3A to 3D.

Figure 3A:
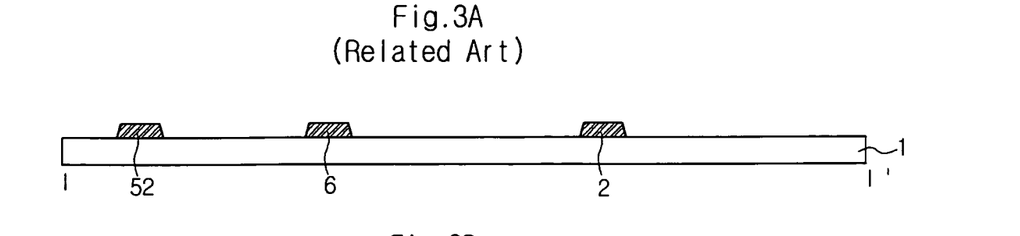
FIGS. 3A to 3D are sectional views illustrating sequential processes of fabricating a TFT array substrate of an LC panel in the related art.

Referring to FIG. 3A, a first conductive pattern group including a gate line 2, a gate electrode 6, and a gate pad lower electrode 52 is formed on a lower substrate 1 using a first mask process. First, a gate metal layer is formed on the lower substrate 1 using a deposition method (e.g., a sputtering method). Thereafter, the gate metal layer is patterned by a photolithography process and an etching process that uses a first mask, so that the first conductive pattern group including the gate line 2, the gate electrode 6, and the gate pad lower electrode 52 is formed.

Figure 3B:
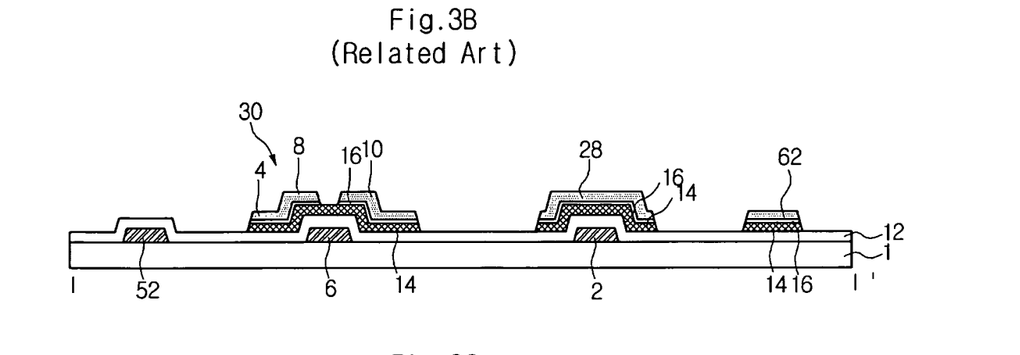

Referring to FIG. 3B, a gate insulating layer 12 is coated on the lower substrate 1 on which the gate pattern is formed. Thereafter, a semiconductor pattern including an active layer 14 and an ohmic contact layer 16, and a second conductive pattern group including, a data line 4, a source electrode 8, a drain electrode 10, and a data pad lower electrode 62, and a storage electrode 28 are formed on the gate insulating layer 12 using a second mask process.

Figure 3C:
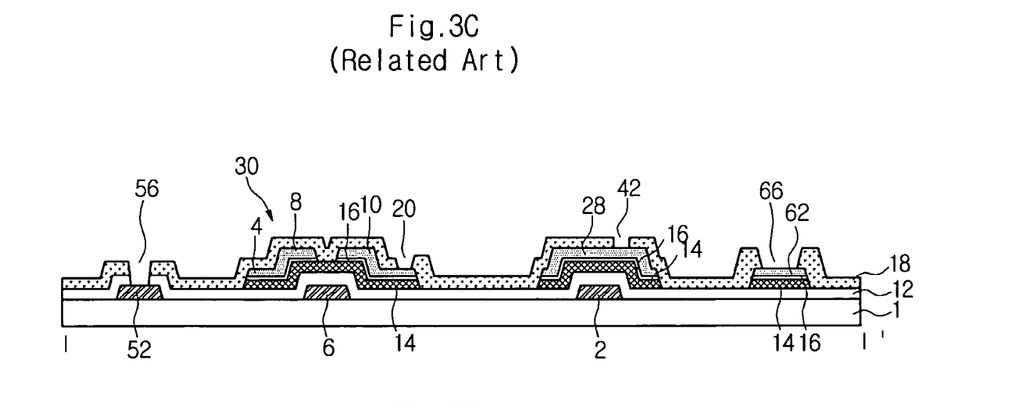

Referring to FIG. 3C, a passivation layer 18 including first to fourth contact holes 20, 42, 56 and 66 are formed by a second mask process on the gate insulating layer 12 on which the second conductive pattern group is formed. Specifically, the passivation layer 18 is formed by a deposition method (e.g., a plasma enhanced chemical vapor deposition (PECVD)) on the entire surface of the gate insulating layer 12 on which the data pattern is formed.

Thereafter, the passivation layer 18 is patterned through a photolithography process and an etching process that use a third mask, so that the first to fourth contact holes 20, 42, 56, and 66 are formed.

The first contact hole 20 penetrates the passivation layer 18 to expose the drain electrode 10, and the second contact hole 42 penetrates the passivation layer 18 to expose the storage electrode 28.

The third contact hole 56 penetrates the passivation layer 18 and the gate insulating layer 12 to expose the gate pad lower electrode 52, and the fourth contact hole 66 penetrates the passivation layer 18 to expose the data pad lower electrode 62.

Figure 3D:
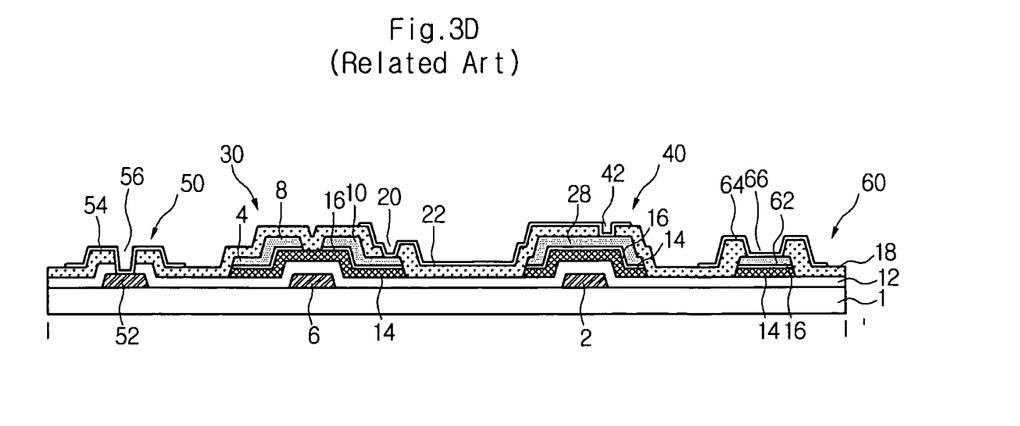

Referring to FIG. 3D, a third conductive pattern group including a pixel electrode 22, a gate pad upper electrode 54, and a data pad upper electrode 64 is formed on the passivation layer 18 using a fourth mask process.

The related art TFT array substrate has the passivation layer 18 for protecting the TFT 30.

The passivation layer 18 is formed by depositing inorganic insulation material using a PECVD apparatus, or coating an organic insulation material using a spin coating apparatus or a spinless coating apparatus.

Because the PECVD apparatus, the spin coating apparatus, or the spinless coating apparatus are required to form the passivation layer 18 as descried above, the manufacturing cost increases. Also, because the data line 4 is formed using a single layer, it is frequently opened. In this case, a separate process is required to repair the opened data line 4. Also, when the passivation layer 18 is formed of an organic insulation material, the pixel electrode 22 is disconnected due to the relatively thick passivation layer 18. Particularly, the pixel electrode 22 is disconnected at the side of the passivation layer 18 exposed by the contact hole 20 where the drain electrode 10 contacts the pixel electrode 22. Then because a pixel signal is not supplied to the pixel electrode 22 through the drain electrode 10, a point defect is generated.

Also, the storage capacitor 40 includes the gate line 2 and the storage electrode 28 that overlap each other with the gate insulating layer 12, the active layer 14, and the ohmic contact layer 16 in between.

In this case, the capacitance of the storage capacitor 40 is degraded by the relatively thick gate insulating layer 12 that insulates the gate line 2 from the storage electrode 28, the active layer 14, and the ohmic contact layer 16. Also, image quality degradation (e.g., spots) is generated due to the relatively low capacitance of the storage capacitor 40. Also, because the data pad is opened when the passivation layer is formed, a defect (e.g., galvanic corrosion of a data pad) may be generated during a subsequent process.

SUMMARY OF THE INVENTION

Accordingly, the present invention is directed to a TFT array substrate and a fabrication method thereof that substantially obviate one or more problems due to limitations and disadvantages of the related art.

An advantage of the present invention is to provide a TFT array substrate and a fabrication method thereof, which can protect TFTs without a passivation layer and reduce the manufacturing cost and the number of the required masks.

Another advantage of the present invention is to provide a TFT array substrate and a fabrication method thereof, which can prevent galvanic corrosion due to opening of a data pad by forming the data pad in a jumping structure of a gate metal pattern and a data metal pattern.

A further another advantage of the present invention is to provide a TFT array substrate and a fabrication method thereof, which can reduce the number of the required processes by separating even/odd data lines to form a static electricity prevention structure.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a TFT array substrate including: a gate electrode connected to a gate line; a source electrode connected to a data line, the data line crossing the gate line to define a pixel region; a drain electrode facing the source electrode with a channel interposed therebetween; a semiconductor layer forming the channel between the source electrode and the drain electrode; a channel passivation layer formed on the channel to protect the semiconductor layer; a pixel electrode disposed in the pixel region to contact with the drain electrode; a storage capacitor including the pixel electrode extending over the gate line to form a storage area on a gate insulating layer on which a semiconductor layer pattern and a metal layer pattern are stacked; a gate pad extending from the gate line; and a data pad connected to the data line.

In another aspect of the present invention, there is provided a method of fabricating a TFT array substrate including: forming a gate electrode, a gate line, a gate pad lower electrode, and a data pad lower electrode on a substrate; forming a gate insulating layer, a first semiconductor layer, a second semiconductor layer, and a data metal layer on the gate electrode; patterning the gate insulating layer, the first and second semiconductor layers, and the data metal layer to form the gate line, the data line, a data line, a TFT region, a gate pad, and a data pad and to form a cut area exposing the gate insulating layer one the gate line; coating a transparent conductive layer on the substrate and patterning the transparent conductive layer to form source and drain electrodes, a first semiconductor layer forming a channel therebetween, a pixel electrode contacting with the drain electrode, a gate pad upper electrode, and a data pad upper electrode in the TFT region; and a channel passivation layer on the first semiconductor layer corresponding to the channel.

forming a gate electrode, a gate line, a gate pad lower electrode, and a data pad lower electrode on a substrate; forming a gate insulating layer, a first semiconductor layer, a second semiconductor layer, and a data metal layer on the gate electrode; patterning the gate insulating layer, the first and second semiconductor layers, and the data metal layer to form patterns at the gate line, the data line, a data line, a TFT region, a gate pad, and a data pad and to form a cut portion exposing the gate insulating layer one the gate line; coating a transparent conductive layer on the substrate and patterning the transparent conductive layer to form source and drain electrodes, a first semiconductor layer forming a channel therebetween, a pixel electrode contacting with the drain electrode, a gate pad upper electrode, and a data pad upper electrode in the TFT region; and a channel passivation layer on the first semiconductor layer corresponding to the channel.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

DETAILED DESCRIPTION OF THE ILLUSTRATED EMBODIMENTS

Reference will now be made in detail to the preferred embodiments of the present invention, examples of which are illustrated in the accompanying drawings.

Figure 4:
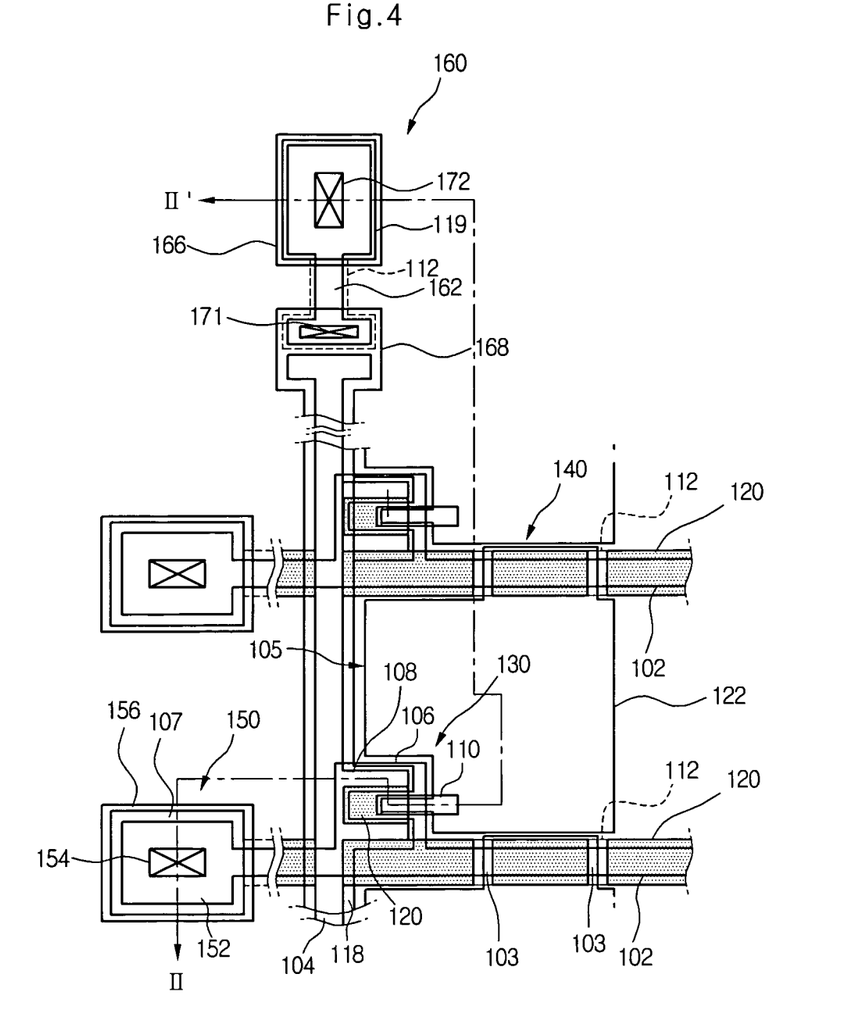
FIG. 4 is a plan view of a TFT array substrate according to the present invention.
Figure 5:
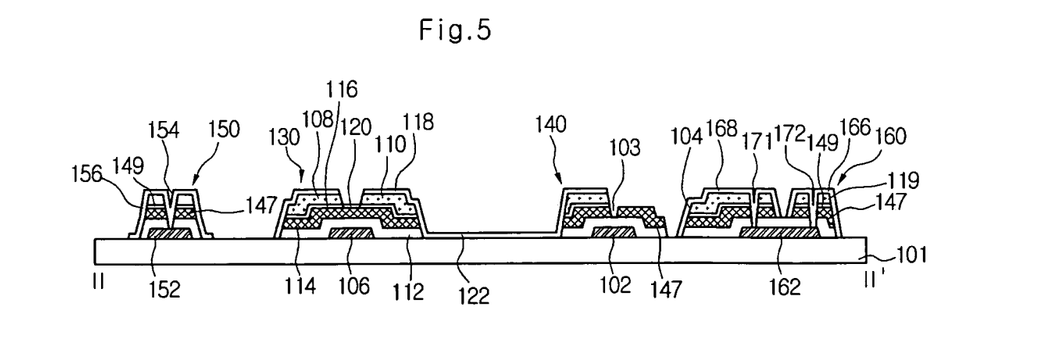
FIG. 5 is a sectional view taken along line II-II' of FIG. 4.

FIG. 4 is a plan view of a TFT array substrate according to the present invention, and FIG. 5 is a sectional view taken along line II-II' of FIG. 4.

Referring to FIGS. 4 and 5, the TFT array substrate includes a gate insulating layer 112 on a lower substrate 101, a TFT 130 formed at each crossing portion, a pixel electrode 122 formed in a pixel region 105 defined by the crossing gate and data lines, and a channel passivation layer 120 for protecting the TFT 130.

Also, the TFT array substrate further includes a storage capacitor 140 formed by an overlapping portion of the gate line 102 and the pixel electrode 122, a gate pad 150 connected to the gate line 102, and a data pad 160 connected to the data line 104 by a jumping structure. The gate line 102 that supplies a gate signal and the data line 104 that supplies a data signal cross to define the pixel region 105. The TFT 130 allows a pixel signal of the data line 104 to be charged and maintained at the pixel electrode 122 in response to a gate signal of the gate line 102.

The TFT 130 has a gate electrode 106 connected to the gate line 102, a source electrode 108 connected to the data line 104, and a drain electrode 110 connected to the pixel electrode 122.

Also, the TFT 130 further includes an active layer 114 that overlaps the gate electrode 106 with the gate insulating layer 112 in between and forms a channel between the source electrode 108 and the drain electrode 110.

A gate insulating layer 112 is formed on the gate line 102, and a pattern of a first semiconductor layer 147 is formed to extend from the active layer 114 on the gate insulating layer 112. A slit 103 is formed around the storage capacitor 140 to expose the gate insulating layer 112, so that the first semiconductor layer 147 is not formed.

The active layer 114 also overlaps the data line 104 and a data pad lower electrode 162.

An ohmic contact layer 116 for an ohmic contact with the data line 104, the source electrode 108, the drain electrode 110, and the data pad lower electrode 162 is further formed on the active layer 114.

The channel passivation layer 120 is formed of silicon oxide (SiOx) or silicon nitride (SiNx) on the active layer 114 forming the channel between the source electrode 108 and the drain electrode 110.

The channel passivation layer 120 prevents the possible damage of the active layer 114 that forms the channel during a stripping process of removing photoresist patterns used when the source electrode 108, the drain electrode 110, and the pixel electrode 122 are formed, and a cleaning process performed before and after all of the processes.

The pixel electrode 122 is connected to the drain electrode 110 of the TFT 130.

A transparent conductive pattern 118 is formed of the same material as the pixel electrode 122 on the source electrode 108, the drain electrode 110, and the data line 104.

The transparent conductive pattern 118 forms a jumping electrode 168 connecting the data line 104 with the data pad 150 in the jumping structure.

The transparent conductive pattern 118 formed on the data line 104 serves as a backup supplying a data signal to the source electrode 108 of the TFT 130 when the data line 104 is cut.

The transparent conductive pattern 118 formed on the source electrode 108 and the drain electrode 110 prevents corrosion of the source electrode 108 and the drain electrode 110 formed of metal (e.g., Mo) vulnerable to corrosion.

The transparent conductive pattern 118 is so spaced as to prevent a short circuit with an adjacent transparent conductive pattern 118 or an adjacent pixel electrode 122.

The transparent conductive pattern 118 formed on the source electrode 108 and the transparent conductive pattern 118 formed on the drain electrode 110 are spaced apart from each other by a predetermined distance, for example, about 4-5 μm, and the transparent conductive pattern 118 formed on the data line 104 and the pixel electrode 122 are also spaced apart from each other by a predetermined distance, for example, about 4-5 μm.

Accordingly, an electric field is formed between the pixel electrode 122 to which a pixel signal is supplied through the TFT 130 and a common electrode (not shown) to which a reference voltage is supplied.

LC molecules between the lower array substrate and the upper array substrate rotate due to dielectric anisotropy by the electric field.

The Light transmittance of the pixel region 105 is changed according to the degree of rotational of the LC molecules, so that a gray scale is realized.

The storage capacitor 140 includes the gate line 102 and the pixel electrode 122 that overlaps the first semiconductor layer 147, a second semiconductor layer 149, and a data metal pattern 119 with the gate line 102 and the gate insulating layer 112 in between.

The storage capacitor 140 allows a pixel signal charged at the pixel electrode 122 to be stably maintained until a next pixel signal is charged. The gate pad 150 is connected to the gate driver (not shown) to supply a gate signal to the gate line 102.

The gate pad 150 includes a gate pad lower electrode 152 extending from the gate line 102, and a gate pad upper electrode 156 connected to the gate pad lower electrode 152 through a contact hole 154 that penetrates the gate insulating layer 112, the first semiconductor layer 147, the second semiconductor layer 149, and the data metal pattern 119.

Also, the data pad 160 is connected to a data driver (not shown) to supply a data signal to the data line 104.

The data pad 160 includes a data pad lower electrode 162 formed in a gate pattern on the substrate and a data pad upper electrode 166 connected to the data pad lower electrode 162 with the first semiconductor layer 147, the second semiconductor layer 149, and the data metal pattern 119 in between.

The data pad 160 formed of the gate pattern is connected to the data line 104 with a jumping structure with the gate insulating layer 112 in between.

The jumping structure includes the data pad lower electrode 162 formed of the gate pattern, and a jumping electrode 168, which is a transparent conductive layer, connecting the data pad lower electrode 162 to the data line 104.

Figure 6A:
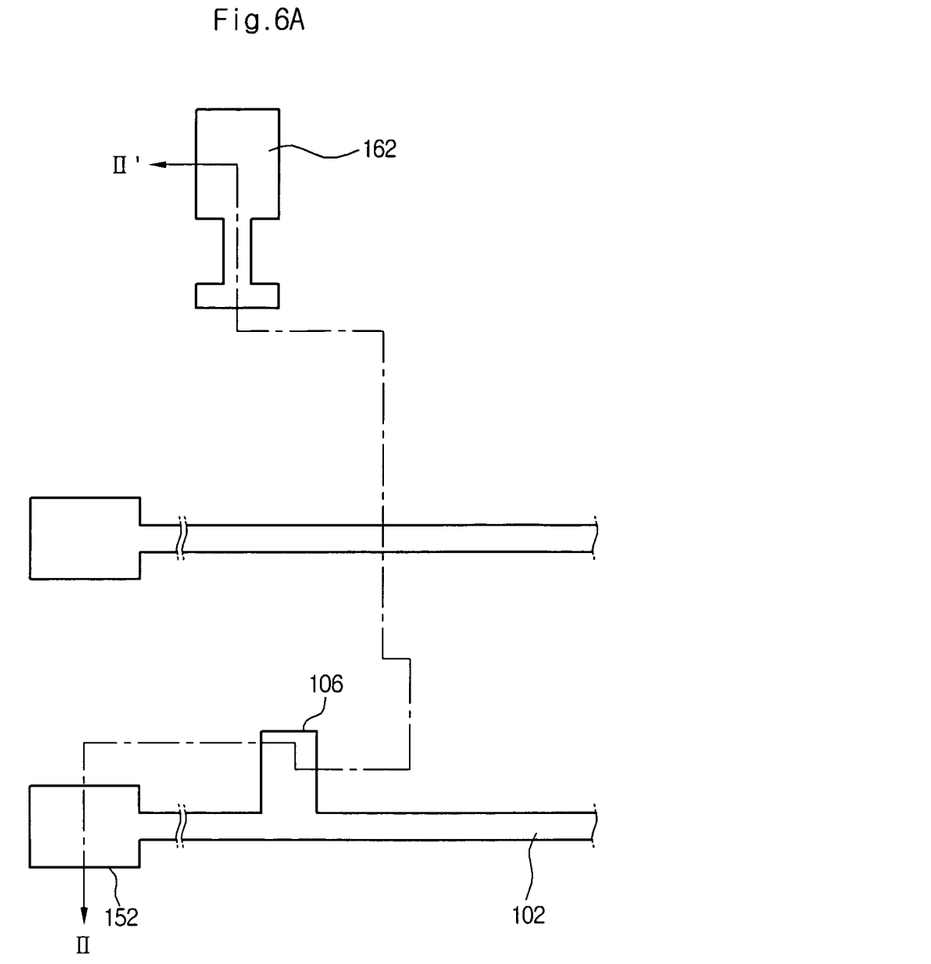
FIGS. 6A and 6B are respectively a plan view and a sectional view illustrating a method of fabricating a first conductive pattern group by a first mask process on the TFT array substrate according to the present invention.
Figure 6B:
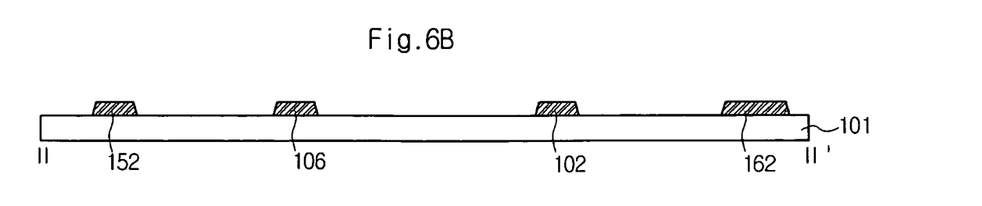

FIGS. 6A and 6B are respectively a plan view and a sectional view illustrating a method of fabricating a first conductive pattern group by a first mask process in the TFT array substrate according to the present invention.

Referring to FIGS. 6A and 6B, a first gate pattern group that includes the gate line 102, the gate electrode 106, the gate pad lower electrode 152, and the data pad lower electrode 162 is formed on the lower substrate 101 and are formed using a first mask process.

A gate metal layer is formed on the lower substrate 101 using a deposition method such as a sputtering.

Then, the gate metal layer is patterned through a photolithography process and an etching process that use the first mask, thereby forming a gate pattern that includes the gate line 102, the gate electrode 106, the gate pad lower electrode 152, and the data pad lower electrode 162.

Here, the gate metal layer may be formed of aluminum or aluminum-based metal such as aluminum/neodymium (Al/Nd). Also, the gate metal layer may be formed of a double layered line or a triple layered line.

Figure 7A:
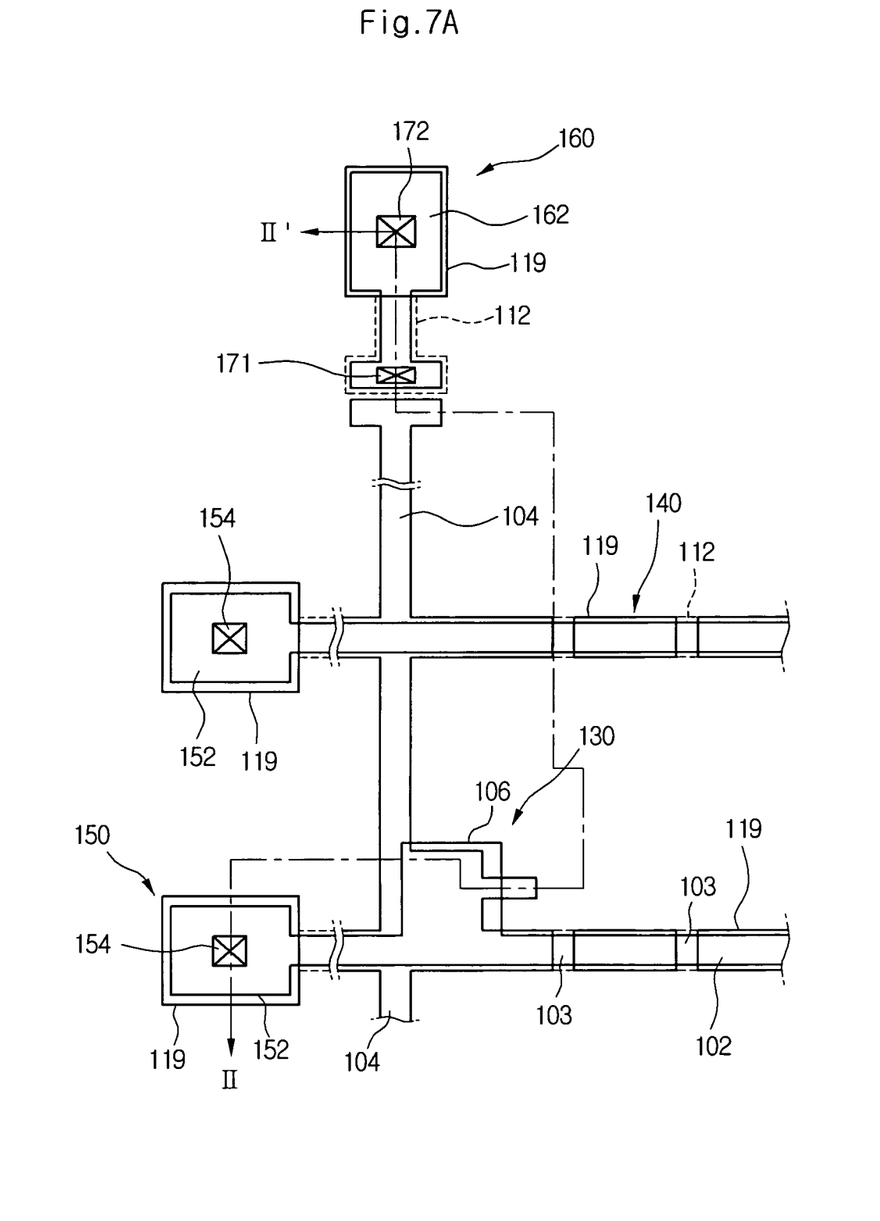
FIGS. 7A and 7B are respectively a plan view and a sectional view illustrating a method of fabricating a semiconductor pattern, a second conductive pattern group, and a channel passivation layer by a second mask process on the TFT array substrate according to the present invention.
Figure 7B:
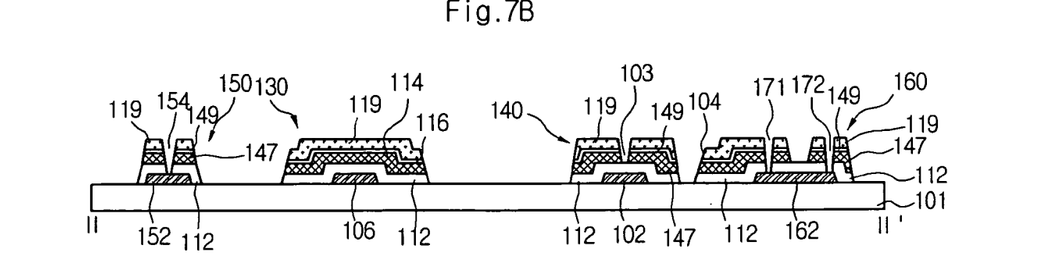

FIGS. 7A and 7B are respectively a plan view and a sectional view illustrating a method of fabricating a semiconductor pattern, a second conductive pattern group, and a channel passivation layer by a second mask process in the TFT array substrate according to the present invention.

Referring to FIGS. 7A and 7B, the gate insulating layer 112 is coated on the lower substrate 101 on which the first conductive pattern group is formed.

A first semiconductor layer 147, a second semiconductor layer 149, and a data metal layer 151 are stacked on the gate insulating layer 112.

Next, a semiconductor pattern that includes an active layer 114 and an ohmic contact layer 116, and a data metal pattern 119 (second conductive pattern group) that includes a data line 104, a source electrode 108, and a drain electrode 110 are formed on the gate insulating layer 112 using a second mask process.

The semiconductor pattern including the active layer 114 and the ohmic contact layer 116, and the second conductive pattern group 119 including a metal layer are formed also on a gate line 102 and a gate pad 150, thereby preventing the gate line 102 from being etched during a subsequent removal of the gate insulating layer 112.

The exposed gate insulating layer 112 is removed using the photoresist as a mask.

The gate pad 150 that extends from the gate line 102, the gate insulating layer 112, a first semiconductor layer 147, a second semiconductor layer 149, and a data metal pattern 119 are stacked on the gate pad lower electrode 152, and a contact hole 154 is formed to expose the gate pad lower electrode 152.

A gate insulating layer 112, a first semiconductor layer 147, a second semiconductor layer 149, and a data metal pattern 119 are sequentially stacked on the gate pad lower electrode 162 formed of a gate pattern, and contact holes 171 and 172 are formed to expose the data pad lower electrode 162.

A first semiconductor layer 147, a second semiconductor layer 149, and a data metal pattern 119 are formed on the gate line 102. The first semiconductor pattern 147, the second semiconductor pattern 149, and the data metal pattern 119 are removed to expose the gate insulating layer 112 around a position where a storage capacitor is to be formed, thereby forming a slit 103 exposing the gate insulating layer 112.

FIGS. 8A to 8F are sectional views illustrating sequential processes of fabricating the second conductive pattern group according to the present invention.

Figure 8A:
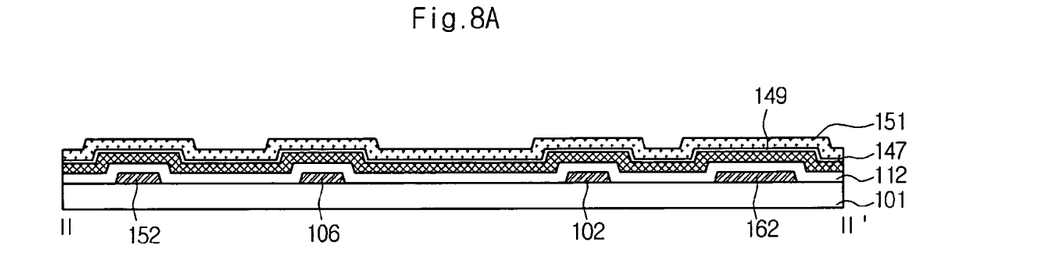
FIGS. 8A to 8F are sectional views illustrating sequential processes of fabricating the second conductive pattern group according to the present invention.

Referring to FIG. 8A, the first semiconductor layer 147, the second semiconductor layer 149, and the data metal layer 151 are sequentially formed on the gate insulating layer 112 using a deposition method such as a sputtering.

The first semiconductor layer 147 may be formed of amorphous silicon not doped with impurities and the second semiconductor layer 149 may be formed of amorphous silicon doped with N-type impurities or P-type impurities.

The data metal layer 151 is formed of metal such as molybdenum (Mo) and copper (Cu).

Figure 8B:
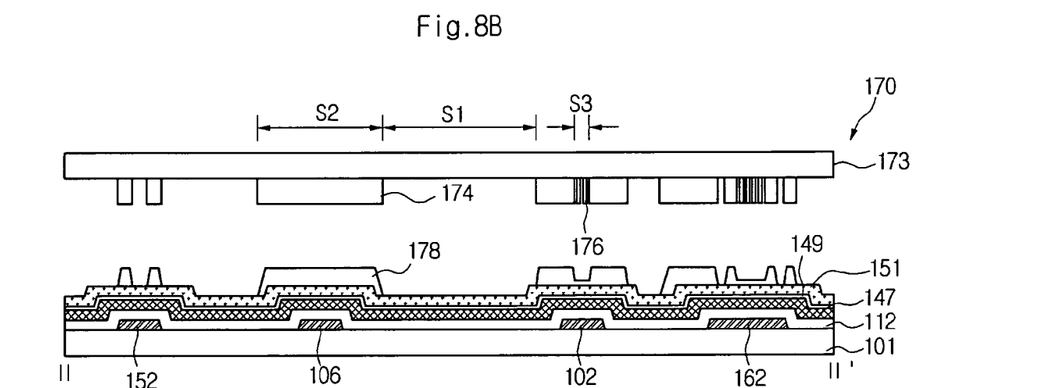

Next, a photoresist layer is formed on the data metal layer 151 and a partially opaque second mask 170 is aligned over the lower substrate 101 as illustrated in FIG. 8B.

The second mask 170 includes a mask substrate 173 made of a transparent material, a blocking portion 174 formed in a blocking region S2 of the mask substrate 173, and a diffractive exposure portion (or semipermeable portion) 176 formed in a partial exposure region S3 of the mask substrate 173.

A region where the mask substrate 173 is exposed becomes an exposure region S1.

The photoresist layer is exposed to light using the second mask 170 and then developed, to form a photoresist pattern 178 having a step difference in the blocking region S2 and the partial exposure region S3 that correspond to the blocking portion 174 and the diffraction exposure portion 176 of the second mask 170, respectively.

The photoresist pattern 178 where the partial exposure region S3 has a second height h2 lower than a first height h1 of the photoresist pattern 178 formed at the blocking region S2.

Figure 8C:
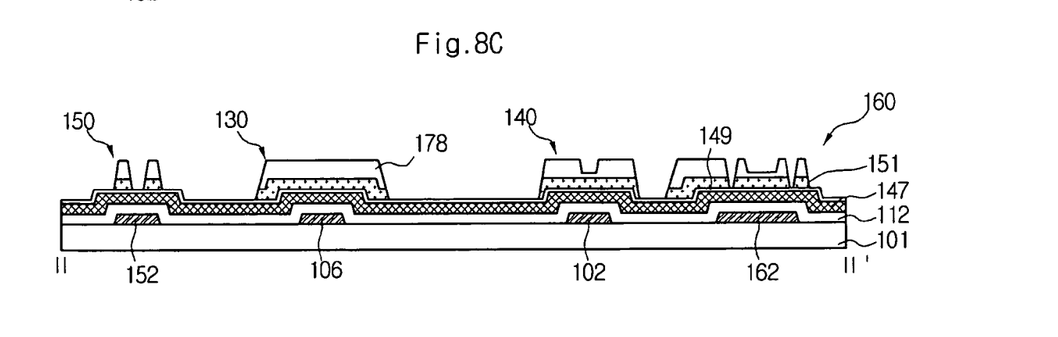

Referring to FIG. 8C, the data metal layer 151 is patterned through a wet etching process using the photoresist pattern 178 as a mask, thereby forming the second conductive pattern group that includes a data line 104, a TFT region 130 extending from the data line 104, the storage capacitor 140, the gate pad 150, and the data pad 160.

Figure 8D:
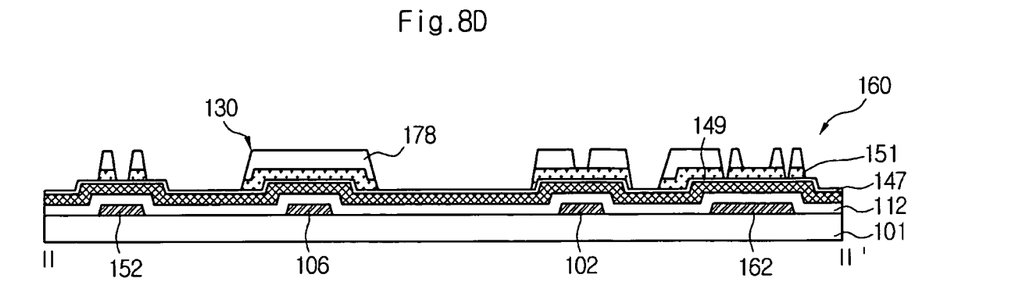

Referring to FIG. 8D, the photoresist pattern 178 having the second height h2 is removed through an ashing process using O2 plasma, and the photoresist pattern 178 having the first height h1 is reduced in height.

Figure 8E:
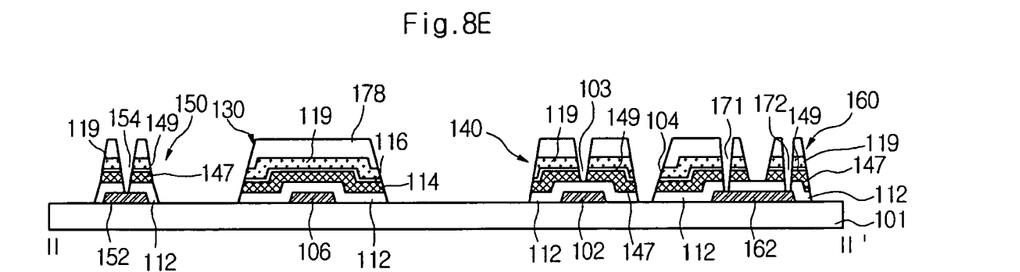

Referring to FIG. 8E, the first semiconductor layer 147, the second semiconductor layer 149, and the gate insulating layer 112 are patterned through a dry etching process using the photoresist pattern 178 as a mask, thereby forming the ohmic contact layer 116, the active layer 114, and the gate insulating layer 112 along the second conductive pattern group.

The gate insulating layer 112 remains in a slit region 103 of the gate line 102, which is blocked by the partial exposure region of the mask, and a region of the data pad lower electrode 162.

Here, the contact holes 154, 171 and 172 are formed on the gate pad 150 and the data pad 160.

Figure 8F:
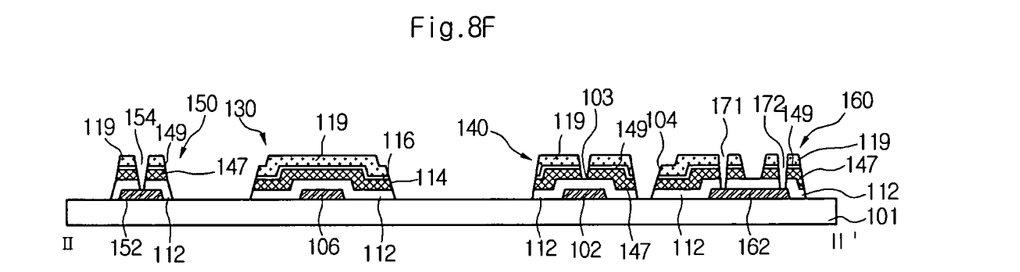

Referring to FIG. 8F, the photoresist pattern 178 is removed by a stripping process.

Figure 9A:
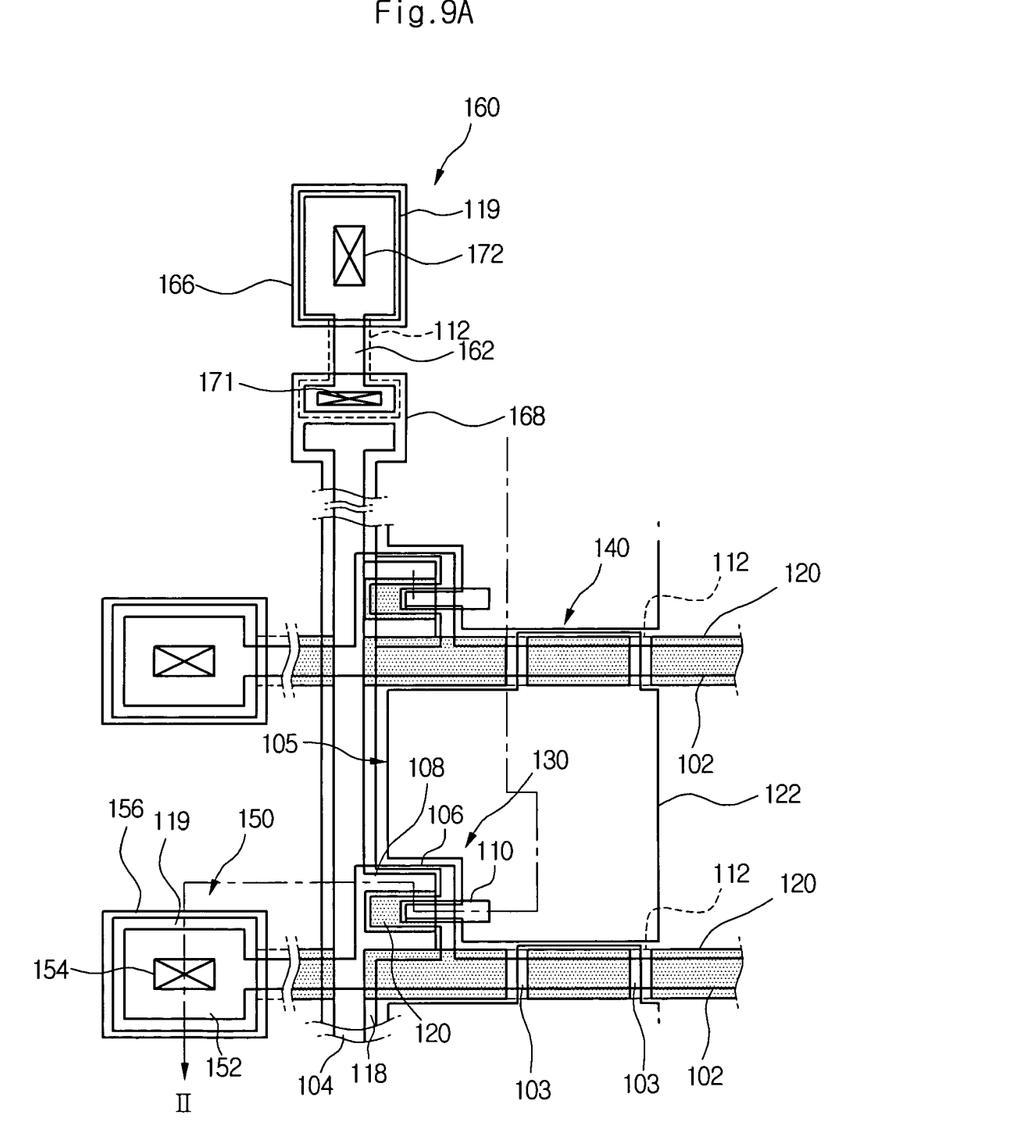
FIGS. 9A and 9B are respectively a plan view and a sectional view illustrating a method of fabricating a semiconductor pattern and a third conductive pattern group by a third mask process in the TFT array substrate according to the present invention.
Figure 9B:
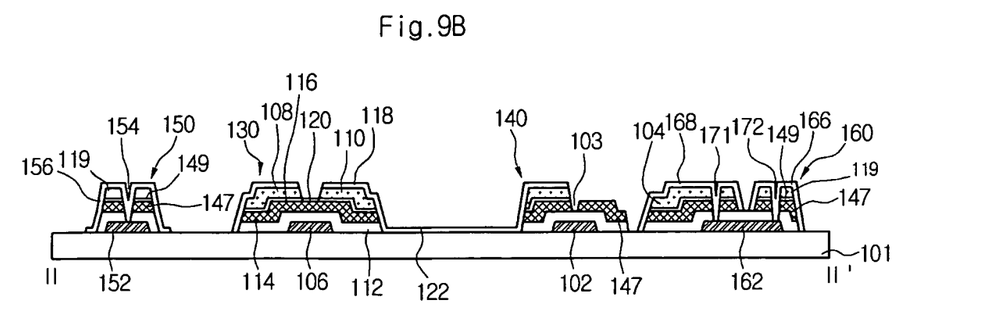

FIGS. 9A and 9B are respectively a plan view and a sectional view illustrating a method of fabricating a semiconductor pattern and a third conductive pattern group by a third mask process in the TFT array substrate according to the present invention.

Referring to FIGS. 9A and 9B, a transparent conductive layer is coated on the substrate 101, and a third conductive pattern group that includes source and drain electrodes 108 and 110, a pixel electrode 122, a transparent conductive pattern 118, a gate pad upper electrode 156, a data pad upper electrode 166, and a jumping electrode 168 is formed on a TFT region 130 using a third mask process.

Specifically, a transparent conductive layer is coated by a deposition method (e.g., a sputtering method) on the substrate 101 where a contact hole is formed.

The transparent conductive layer may be formed of a material selected from the group consisting of an indium tin oxide (ITO), a tin oxide (TO), an indium tin zinc oxide (ITZO), and an indium zinc oxide (IZO).

Thereafter, the transparent conductive pattern is patterned through a photolithography process and an etching process that use a third mask, thereby forming the third conductive pattern group including the pixel electrode 122, the transparent conductive pattern 118, the gate pad upper electrode 156, the data pad upper electrode 166, and the jumping electrode 168.

The third conductive pattern is formed also on the data line 104.

The pixel electrode 122 is connected to the drain electrode 110.

The transparent conductive pattern 118 is formed on and connected directly to the data line 104, the source electrode 108, and the drain electrode 110.

The gate pad upper electrode 156 is electrically connected through the contact hole 154 to the gate pad lower electrode 152.

The data pad upper electrode 166 is connected through a contact hole 172 to the data pad lower electrode 162 formed of a gate pattern.

The jumping electrode 168 formed at the end of the data line to extend from the transparent conductive pattern 118 of the data line 104 is connected to the data pad lower electrode 162 through the contact hole 171.

A channel passivation layer 120 is formed on the active layer 114 that forms the channel between the source electrode 108 and the drain electrode 110.

The second semiconductor layer 149 is removed, so that only the first semiconductor layer 147 remains on the gate line 102 and the gate insulating layer 112 is exposed at the slit 103.

Figure 10A:
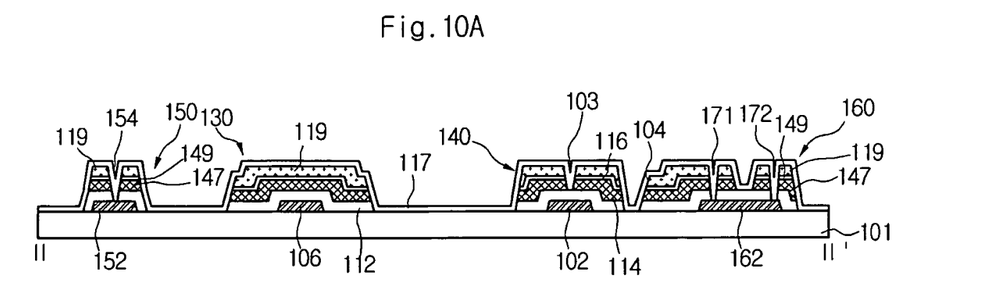
FIGS. 10A and 10E are sectional views illustrating sequential processes of fabricating the third conductive pattern group according to the present invention.
Figure 10B:
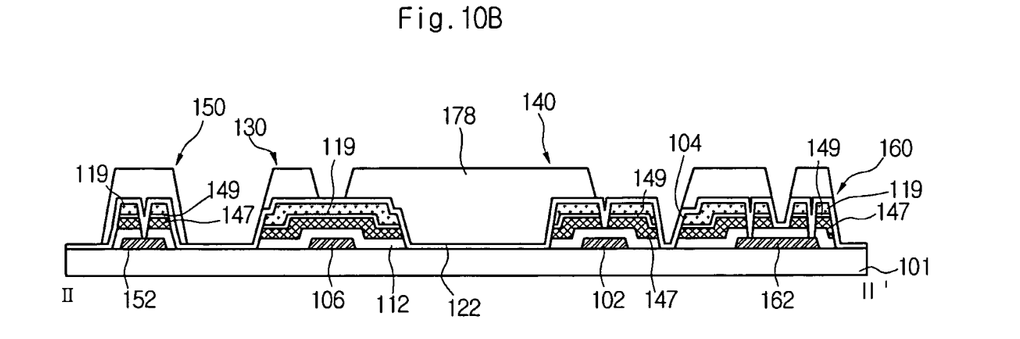
Figure 10C:
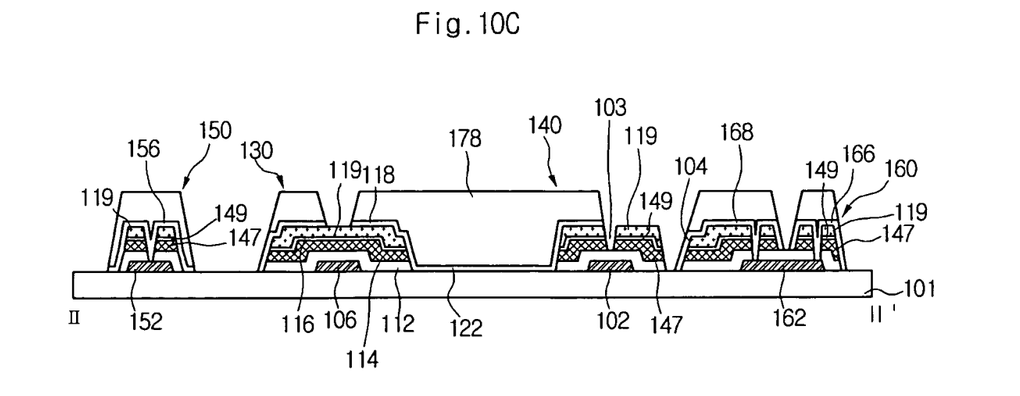
Figure 10D:
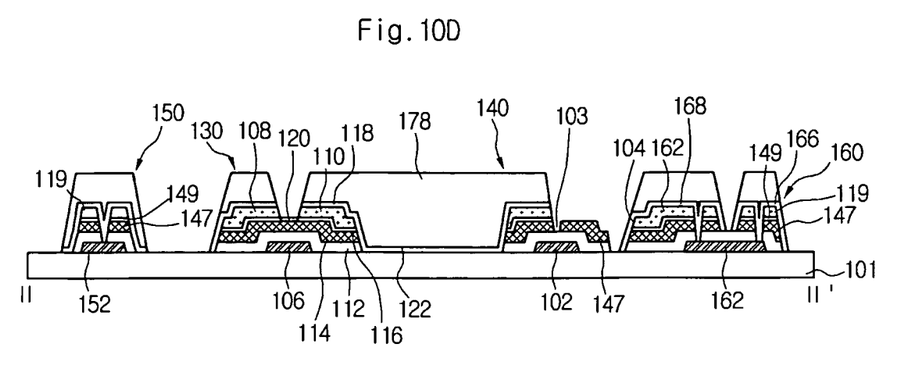
Figure 10E:
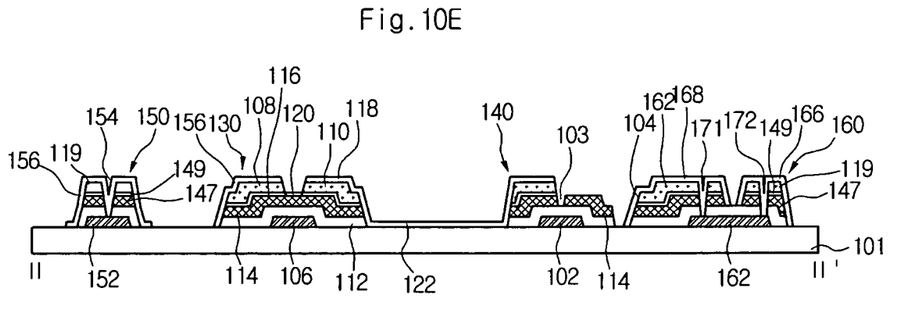

FIGS. 10A and 10E are sectional views illustrating sequential processes of fabricating the third conductive pattern group according to the present invention.

Referring to FIG. 10A, a transparent conductive layer 117 is formed on a substrate where a second conductive pattern group is formed on the gate insulating layer 112.

Referring to FIG. 10B, a photoresist layer is formed on the transparent conductive layer 117, and then the photoresist layer is exposed and developed to form a photoresist pattern 178.

Referring to FIG. 10C, the transparent conductive layer is patterned through a wet etching process using the photoresist pattern 178 as a mask, thereby forming, in the TFT region 130, a third conductive pattern group that includes source and drain electrodes 108 and 110, a pixel electrode 122, a storage capacitor 140 extending from the pixel electrode 122, a transparent conductive pattern 118 on the data line 104, a gate pad upper electrode 156, a data pad upper electrode 166, and a jumping electrode 168.

The data pad 160 includes a data pad lower electrode 162 formed of a gate pattern, and the data pad upper electrode 166 formed of a transparent conductive layer. The data pad lower electrode 162 extends toward the data line 104 and connects to the data line 104 with a jumping structure.

The jumping structure is a structure in which the data line 104 is connected to the data pad lower electrode 162 by a jumping electrode 168. The jumping electrode 168 is connected through a contact hole 171 formed in the data pad lower electrode 162 and may be connected to a transparent conductive pattern 118 formed on the data line 104.

Thereafter, an ohmic contact layer 116 and a data metal pattern 154 formed on a channel portion of a TFT 130 are removed through an etching process using the photoresist pattern 178.

Accordingly, the active layer 114 of the channel portion is exposed to separate the source electrode 108 and the drain electrode 110.

The data metal pattern 119 and the ohmic contact layer 116 exposed on the gate line 102 are also removed at the same time.

The storage capacitor 140 extending from the pixel electrode 122 forms a storage region with a gate line 102, a gate insulating layer 112, a first semiconductor layer 147, a second semiconductor layer 149, and a data metal pattern 119 interposed therebetween. The gate insulating layer 112 is exposed at the slit 103 on the gate line 102.

Referring to FIG. 10d, a surface of the exposed active layer 114 of the channel portion is exposed to Ox (e.g., 02) or Nx (e.g., N2) plasma using the remaining photoresist pattern 178 as a mask.

Accordingly, the ionized Ox or Nx reacts with silicon contained in the active layer 114, thereby forming a channel passivation layer 120 made of SiO2 or SiNx on the channel layer 114 of the channel portion.

The channel passivation layer 120 prevents the active layer 114 of the channel portion from being damaged.

Referring to FIG. 10E, the photoresist pattern 178 remaining on the third conductive pattern group is removed by a stripping process.

The inventive TFT array substrate is attached to the color filter array substrate facing the TFT array substrate and LC is disposed therebetween to form an LC panel.

The color filter array substrate includes color filters formed in the LC cell unit, a black matrix separating the color filters and reflecting outside light, and a common electrode supplying a reference voltage to LC cells in common.

The TFT array substrate undergoes a signal inspection process for detecting a line defect such as a short circuit or a cut signal line, or a defect of the TFT after a manufacturing process.

For the signal inspection process, odd shorting bars and even shorting bars connected to the odd lines and the even lines of the gate lines and the data lines are formed on the TFT array substrate.

Specifically, a data line inspection detects a line defect using the data odd shorting bar connected to the odd data lines and the data even shorting bar connected to the data even lines.

Figure 11:
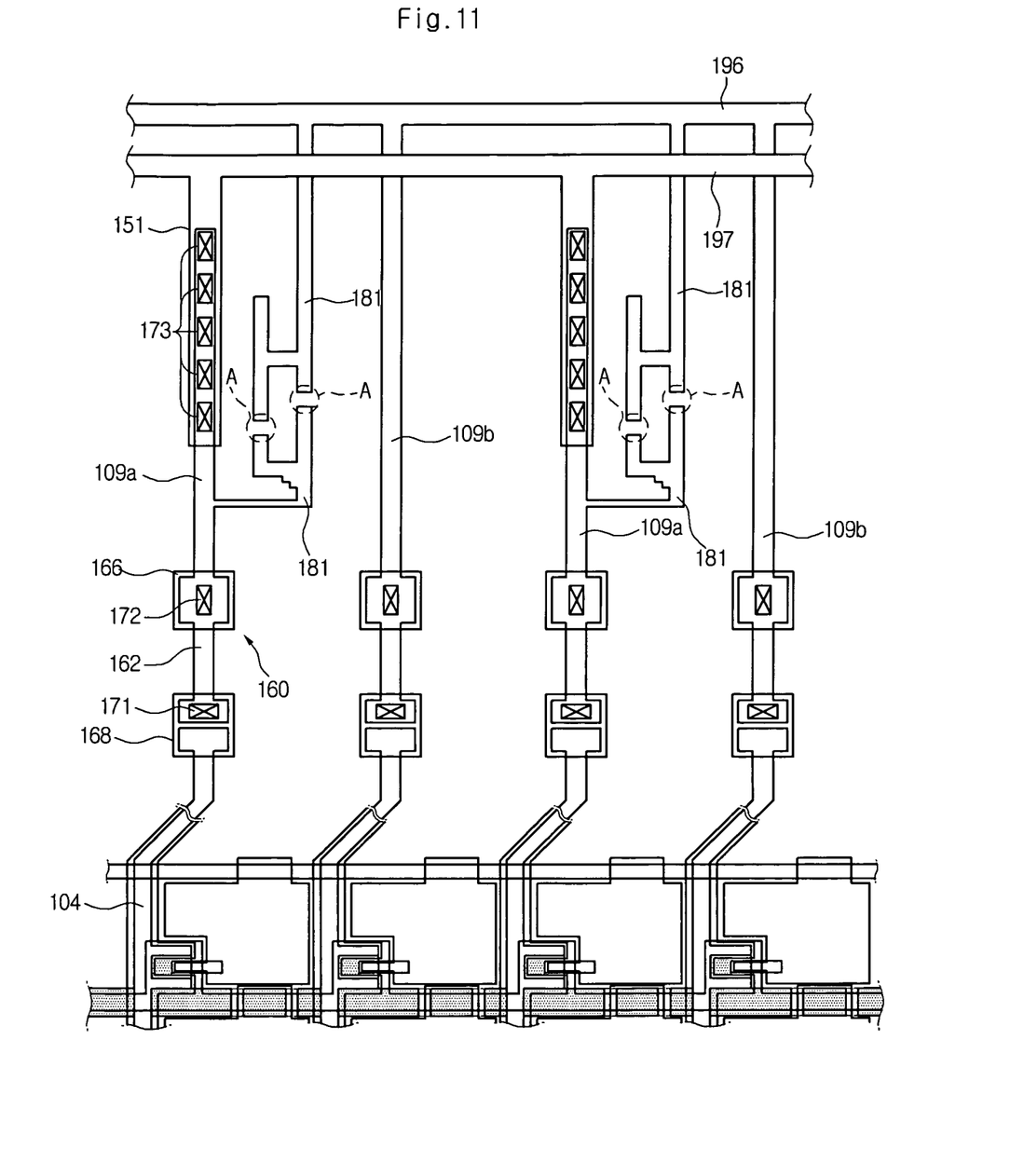
FIG. 11 is a plan view illustrating a portion of an outer pad of the TFT array substrate according to the present invention.

FIG. 11 is a plan view illustrating a portion of an outer pad of the TFT array substrate according to the present invention.

Referring to FIG. 11, the TFT array substrate includes a transistor formed at each crossing of a gate line 102 and a data line 104, and the pixel electrode 122 connected to the TFT 130. The data line 104 forms the data pad 160 by way of data links at the outline.

The data pad 160 is linked by even/odd data lines 109a/109b and connected to the shorting bars 196 and 197.

The data pad 160 and the even/odd data lines 109a/109b connected with the data line 104 by a jumping structure are formed of gate metal, and the even data lines 109a are linked with a data metal pattern 151 through a contact hole 173 and connected to the data even shorting bar 197.

The odd data lines 109b are connected with the data odd shorting bar 196 formed of gate metal.

For preventing static electricity, the even data lines 109a have a H-shaped ground line 181, which has a cut portion A.

The ground line 181 is connected with the data odd shorting bar 196.

The even/odd data lines 109a and 109b form an equipotential through the ground line 181 to prevent static electricity.

At this point, the cut portion A is formed in several µm to allow static electricity to be discharged through the ground line 181 when static electricity is generated.

Thereafter, the data even/odd shorting bars 196 and 197 are cut and removed when an LC panel is formed.

Because the TFT array substrate and the fabrication method thereof according to the present invention do not require a separate device for forming the passivation layer, the manufacturing cost may be reduced and opening of the pixel electrode at the step portion of the contact hole for exposing the drain electrode may be prevented.

Also, the TFT array substrate and the fabrication method thereof may supply a pixel signal to each TFT using the transparent conductive pattern without a repair process when an open defect of the data line is generated and may prevent corrosion of the data line, the source electrode, and the drain electrode.

Also, in the TFT array substrate and the fabrication method thereof, the distance between two conductors forming the storage capacitor is small, so that capacitance of the capacitor increases and image quality deterioration (e.g., a blot) may be improved.

The TFT array substrate and the fabrication method thereof may prevent galvanic corrosion of the data pad.

Also, the TFT array substrate and the fabrication method thereof form a static electricity prevention structure by separating the even data line and the odd data line, so that the number of processes may be reduced.

Also, the number of the required masks may be reduced to simplify the fabrication process and reduce the manufacturing cost.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A TFT (thin film transistor) array substrate comprising:
   a gate electrode connected to a gate line on a substrate;
   a source electrode connected to a data line, the data line crossing the gate line to define a pixel region;
   a drain electrode facing the source electrode with a channel interposed therebetween;
   a semiconductor layer including an ohmic contact layer and an active layer forming the channel between the source electrode and the drain electrode;
   a channel passivation layer formed on the channel;
   a pixel electrode in the pixel region to contact directly with an entire upper surface of the drain electrode;
   a storage capacitor including the pixel electrode extending over the gate line to form a storage area on a gate insulating layer on which a semiconductor layer pattern and a metal layer pattern are stacked;
   a slit formed around the storage capacitor to expose a top surface of the gate insulating layer;
   a gate pad connected to the gate line;
   a data pad connected to the data line; and
   a transparent conductive pattern formed directly on an entire upper surface of the source electrode,
   wherein the transparent conductive pattern is formed of the same material as the pixel electrode,
   wherein the transparent conductive pattern forms a jumping electrode connecting the data line with a lower electrode of the data pad through a contact hole,
   wherein the channel passivation layer is a surface of the active layer oxidized or nitrided, and
   wherein the pixel electrode is disposed in the pixel region to contact directly with the substrate.

2. The TFT array substrate according to claim 1, wherein the channel passivation layer is formed of one of SiNx and SiOx.

3. The TFT array substrate according to claim 1, further comprising:
   even/odd data lines for applying signals to the data pad; and
   static electricity prevention line patterns connected to one of the even/odd data lines and spaced apart from one another by a predetermined distance.

4. The TFT array substrate according to claim 3, wherein the even/odd data lines are connected to data oven/odd shorting bars.

5. The TFT array substrate according to claim 1, wherein the transparent conductive pattern is spaced to prevent a short circuit with at least one of an adjacent transparent conductive pattern and an adjacent pixel electrode.

* * * * *